United States Patent [19]
Sakurai

[11] Patent Number: 5,566,447
[45] Date of Patent: Oct. 22, 1996

[54] PICK-UP POINT CORRECTION DEVICE FOR MOUNTER

[75] Inventor: Hiroshi Sakurai, Iwata, Japan

[73] Assignee: Yamaha Hatsudoki Kabushiki Kaisha, Iwata, Japan

[21] Appl. No.: 363,374

[22] Filed: Dec. 23, 1994

[30] Foreign Application Priority Data

Dec. 27, 1993 [JP] Japan .................. 5-331222

[51] Int. Cl.⁶ .................. H05K 3/30; B23P 19/00
[52] U.S. Cl. .................. 295/832; 29/740; 29/709; 29/711
[58] Field of Search .................. 29/832, 833, 740, 29/709, 711

[56] References Cited

U.S. PATENT DOCUMENTS

| | | |
|---|---|---|
| 3,337,941 | 8/1967 | Drop . |
| 3,487,226 | 12/1969 | Yetter, et al. . |
| 3,622,396 | 11/1971 | Fernandez et al. . |
| 3,624,401 | 11/1971 | Stoller . |
| 3,876,877 | 4/1975 | Meulensteen et al. . |
| 4,092,719 | 5/1978 | Salmon . |
| 4,144,449 | 3/1979 | Funk et al. . |
| 4,151,945 | 5/1979 | Regard et al. . |
| 4,247,767 | 1/1981 | O'Brien et al. . |
| 4,346,293 | 8/1982 | Fetzer . |
| 4,383,359 | 5/1983 | Suzuki et al. . |
| 4,615,093 | 10/1986 | Tews et al. . |
| 4,738,025 | 4/1988 | Arnold .................. 29/833 X |
| 4,881,319 | 11/1989 | Yagi et al. .................. 29/740 X |
| 5,084,962 | 2/1992 | Takahashi et al. .................. 29/833 |
| 5,249,349 | 10/1993 | Kuinose et al. .................. 29/833 X |
| 5,249,356 | 10/1993 | Okuda et al. .................. 29/833 |
| 5,342,460 | 8/1994 | Hidese .................. 29/833 X |
| 5,384,956 | 1/1995 | Sakurai et al. .................. 29/833 X |

FOREIGN PATENT DOCUMENTS

| | | |
|---|---|---|
| 416878A1 | 3/1991 | European Pat. Off. . |
| 471272A1 | 2/1992 | European Pat. Off. . |
| 2834836 | 6/1979 | Germany . |
| WO92/14988 | 9/1992 | WIPO . |

OTHER PUBLICATIONS

*Signal Processing and System Control Factory Automation*, 16th Annual Conference of IEEE Industrial Electronics Society, Nov. 27–30, 1990, pp. 798–804.

Patent Abstracts of Japan, vol. 10 No. 32 (E–379), 7 Feb. 1986 and JP–A–60 189951 (FUJITSU KK) 27 Sept. 1985.

*Primary Examiner*—Carl J. Arbes
*Attorney, Agent, or Firm*—Knobbe, Martens, Olson & Bear

[57] ABSTRACT

The invention is an apparatus and method for picking up a component at a pick up station and depositing that component in an accurate position at a deposit station. The apparatus includes a gripping device movable between a component delivery position and a component mounting position, a detector for measuring at least one parameter of a component picked up by said gripping device and a controller connected to said gripping device and said detector. The controller includes means for calculating a picked up position of a component picked up by the gripping device, means for calculating a pick up location correction amount, means for calculating an average pick up location correction amount from a specified number of pick up location correction amount data and pick up point changing means for setting a new pick up location.

30 Claims, 6 Drawing Sheets

PICK-UP POINT CORRECTION DEVICE FOR MOUNTER

BACKGROUND OF THE INVENTION

This invention relates to a method and apparatus for mounting components and more particularly to an improved method and apparatus for more precisely picking up components to be mounted on a substrate.

A wide variety of types of apparatus have been proposed for picking up small components such as integrated circuits, resistors or the like, and mounting these components at an accurate location on a substrate. The components are normally picked up by a pick-up device such as a vacuum pick-up nozzle from a feeder station. When the components are picked up, their orientation relative to the pick-up device cannot be accurately controlled so as to insure precision mounting. Therefore, it has been proposed to provide various ways in which the orientation of the component, as picked up by the pick-up device, is determined, and then the mounting position is corrected to accommodate errors in the pick-up location.

The co-pending application of the inventor hereof, entitled "Method For Mounting Components And An Apparatus Therefor," Ser. No. 08/073,741, filed Jun. 8, 1993, and assigned to the assignee hereof, discloses a method whereby optically it is possible to determine the orientation of a component picked up by the pick-up device by rotating the component and measuring the projected length of the component in two (2) angular positions. From these measurements, the actual location of the component can accurately be determined and the corrective factors calculated.

In the above mounter, the pick-up point of the pick-up nozzle is typically preset by the program. Often, however, this preset location will not precisely correspond to the position of the tape feeder on the component supply section due to a mechanical error by the tape feeder or a drive error by the mounting apparatus.

Unfortunately, the greater the magnitude of this error, the more likely that there will be an error in the correction. In addition, the need to correct for this error slows the mounting process. Finally, if the error magnitude is great, the pick-up device may not properly pick-up the component.

SUMMARY OF THE INVENTION

The invention is an apparatus and method for picking up a component at a pick up station and depositing that component in an accurate position at a deposit station. The apparatus includes a gripping device movable between a component delivery position and a component mounting position, a detector for measuring at least one parameter of a component picked up by said the gripping device and a controller connected to said gripping device and said detector. The controller includes means for calculating a picked up position of a component picked up by the gripping device, means for calculating a pick up location correction amount, means for calculating an average pick up location correction amount from a specified number of pick up location correction amount data and pick up point changing means for setting a new pick up location.

DETAILED DESCRIPTION OF THE PREFERRED EMBODIMENT OF THE INVENTION

Figure 1:
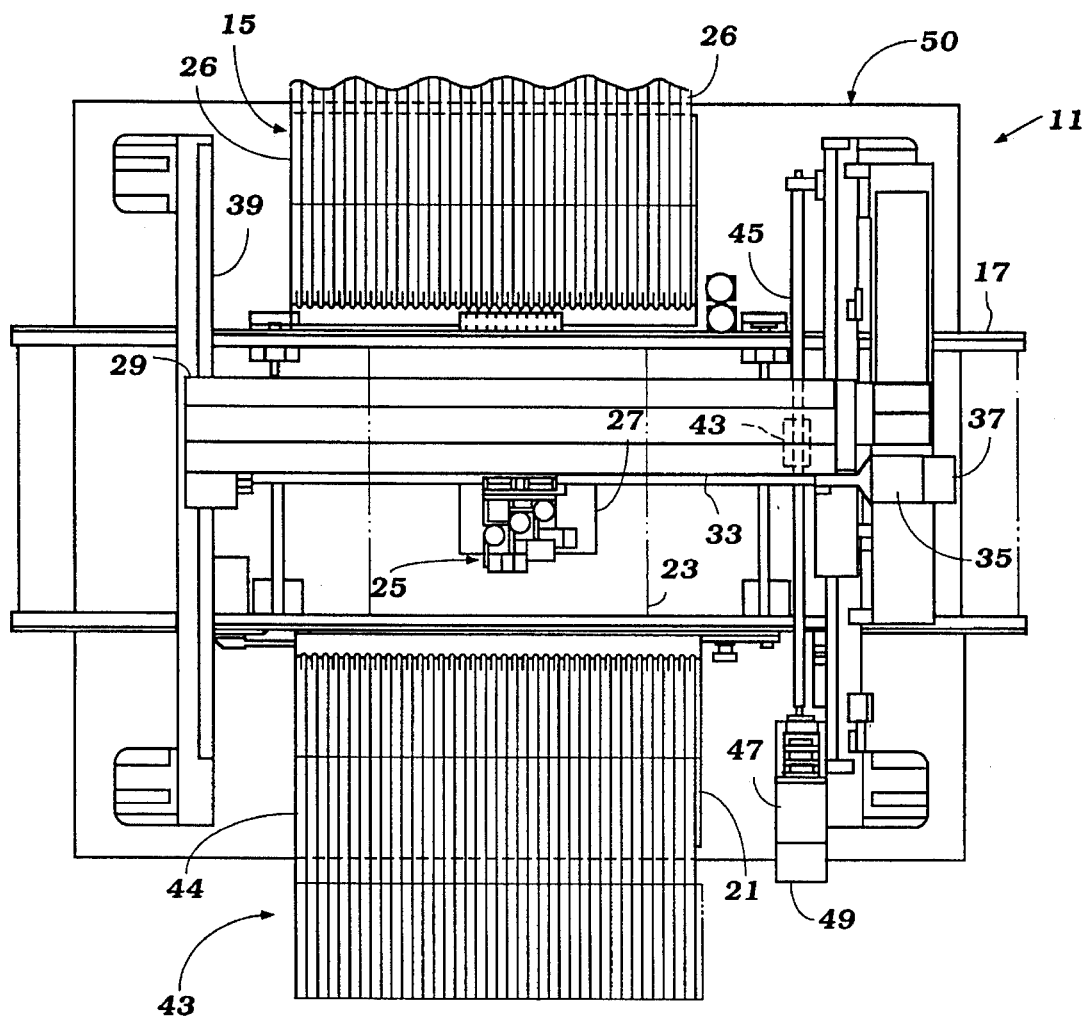
FIG. 1 is a top plan view of a component mounting apparatus constructed in accordance with an embodiment of the invention.
Figure 2:
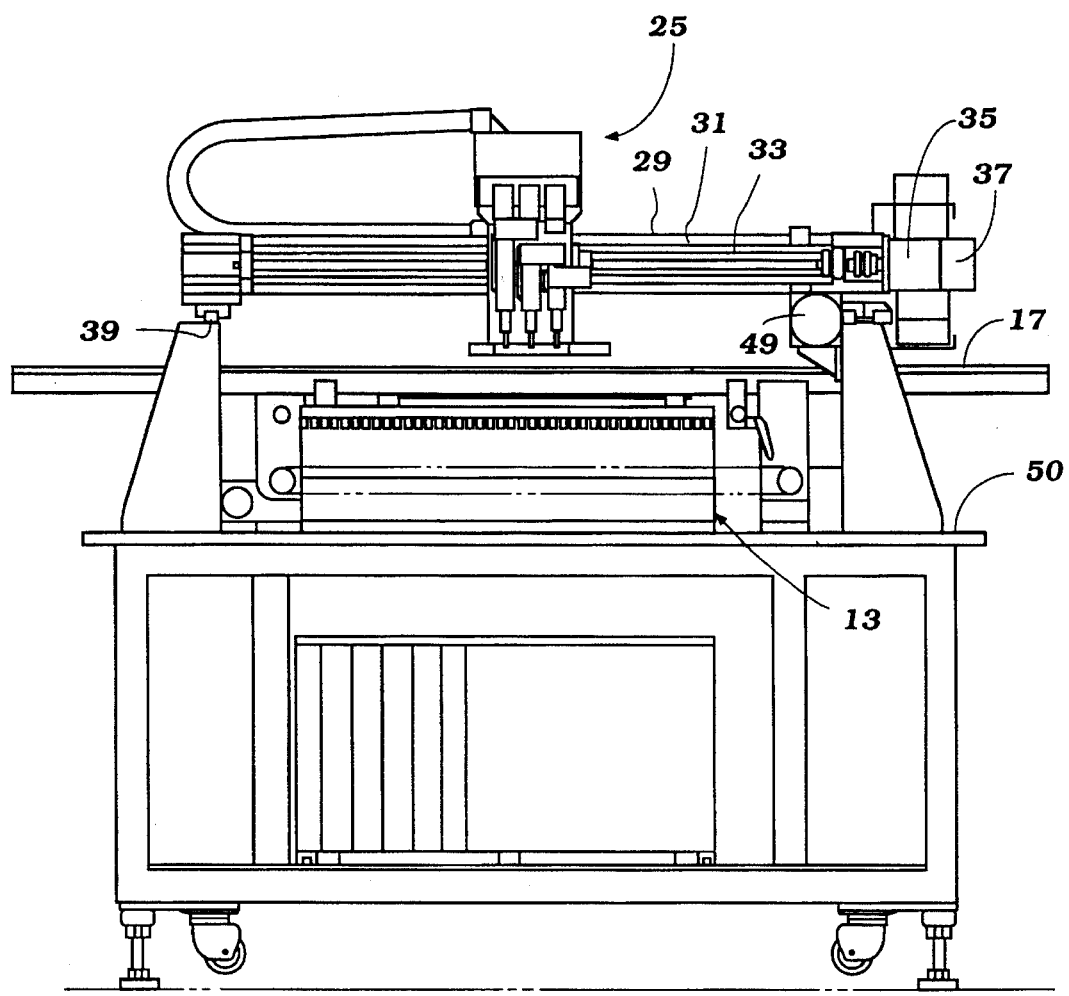
FIG. 2 is a front elevational view of the component mounting apparatus of FIG. 1.

Referring now in detail to the drawings and initially to FIGS. 1 and 2, a component mounting apparatus constructed and operated in accordance with the preferred embodiment of the invention is identified generally by the reference numeral 11. The apparatus 11 is adapted to mount small components such as integrated circuits, resistors, capacitors or the like which are supplied at respective delivery stations 13 and 15 disposed on opposite sides of a conveyor assembly 17. The delivery stations 13 and 15 comprise a plurality of individual feeders 19 and 21, each of the type comprising a roll of tape having pockets in which components to be mounted are contained. These tapes are advanced by a ratchet mechanism under a control as is well known.

The conveyor 17 selectively presents a substrate, indicated at 23, to a mounting area positioned between the delivery stations 13 and 15. A pick-up and recognition device, indicated generally by the reference numeral 25, is mounted for movement in an X-Y plane so as to selectively pick up components from the feeders 19 and 21 and position them on the substrate 23 at the desired location. In addition, the pick-up and recognition device 25 cooperates so as to provide an indication of the orientation of the components picked up thereby so as to adjust for their mounting position, as will be described.

The pick-up and recognition device 25 includes a mounting head 27 which is mounted for movement along a carriage 29 by means of guide rails 31 and a driving feed screw 33. The feed screw 33 has a ball mount connection with the mounting head 27 so that upon rotation of the feed screw 33, the mounting head 27 will move in the X axis direction.

An X axis drive motor 35 is mounted at one end of the carriage 29 and is coupled to the feed screw 33 for driving in clockwise or counter clockwise directions so as to appropriately position the mounting head 29. An encoder 37 is coupled to the X axis drive motor 35 and provides an X coordinate positional signal to a control apparatus as shown in the block diagram of FIG. 4.

The carriage 29 is mounted for movement in the Y direction on a pair of guide rails 39 which are disposed at opposite sides of an area where the substrate or printed circuit boards 23 are disposed and outwardly of the ends of the feeder sections 13 and 15. It will be appreciated that this arrangement permits movement of the carriage 29 along the guide rails 39.

Figure 4:
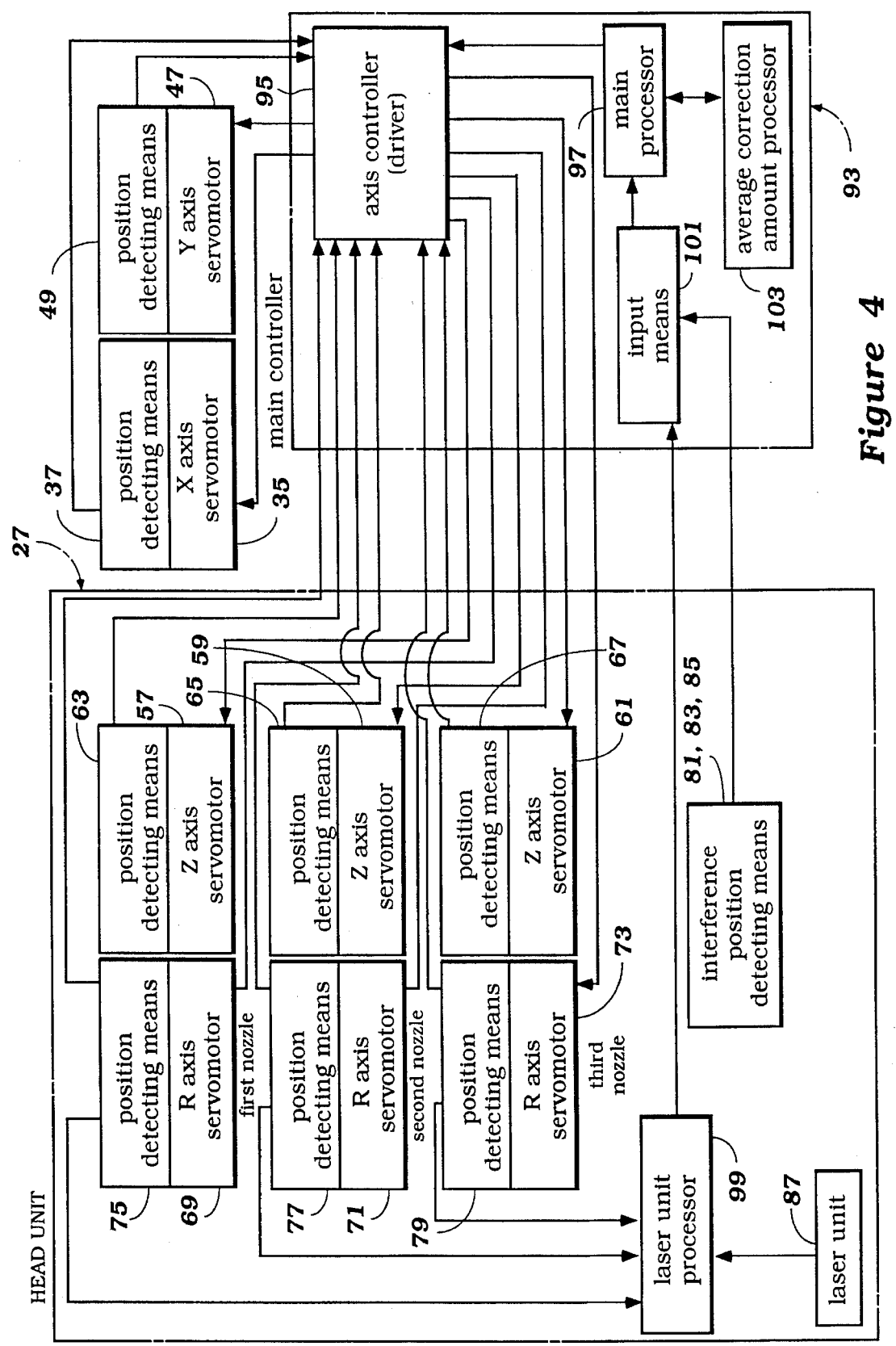
FIG. 4 is a block diagram showing the interrelationship between the various components of the preferred embodiment of the invention.

The carriage 29 is provided with a recirculating ball nut 43 which is engaged with a feed screw 45 that is journaled on one of the guide rails 39. This feed screw 45 is driven by a reversible electric motor 47 so as to move the carriage 29 and mounting head 27 in the Y direction. An encoder 49 is coupled to the Y-axis drive motor 47 and, as shown in FIG. 4, provides an output signal indicative of the Y coordinate position of the mounting head 27.

The entire assembly as thus far described may be mounted conveniently on a table 50 so that the apparatus can be moved from location to location, but can also be retained in position.

Figure 3:
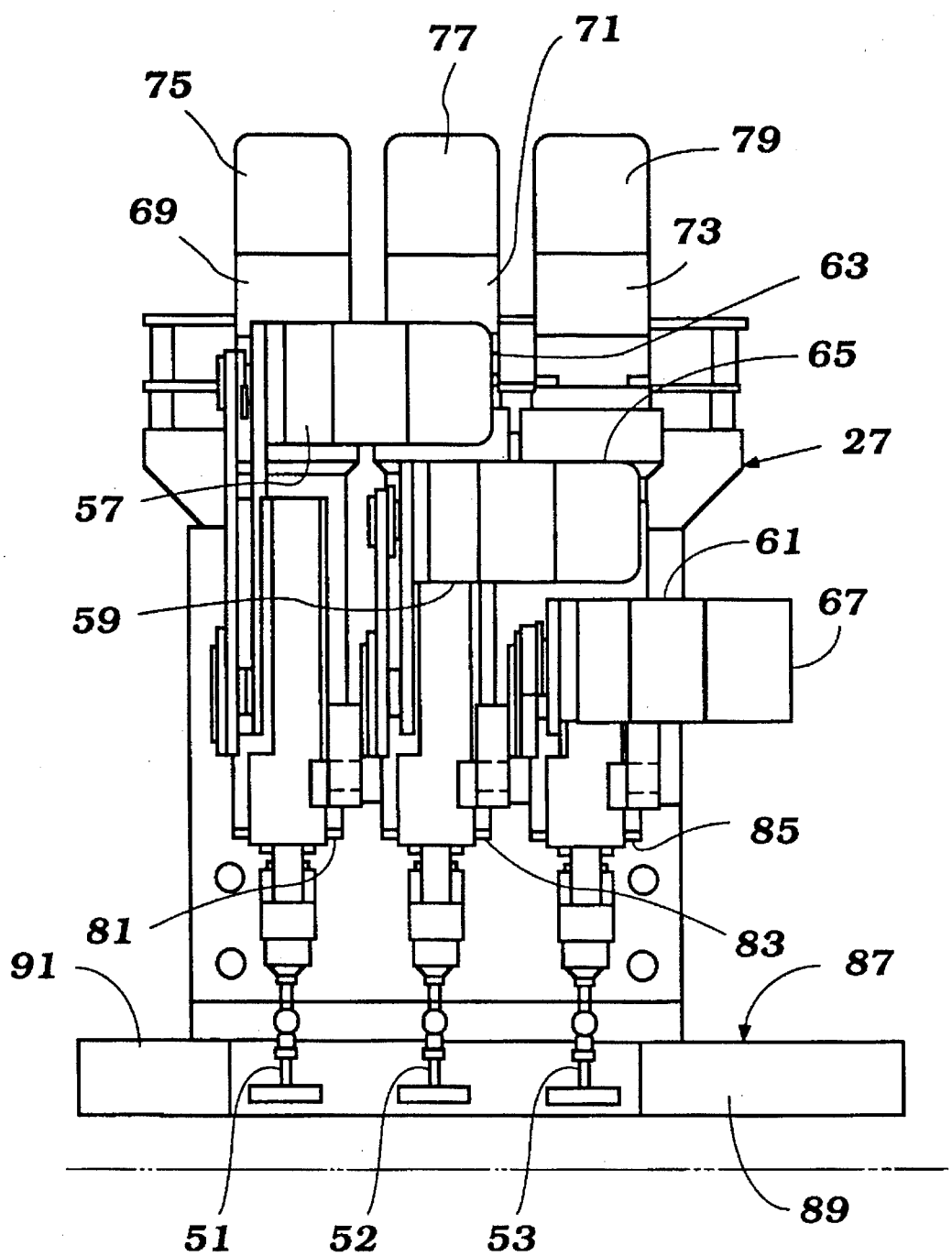
FIG. 3 is an enlarged front elevational view showing the detecting station of FIG. 1.

The construction of the pick-up and recognition device 25 will now be made by reference to FIG. 3. Referring to FIG. 3, it should be noted that the mounting head 27 carries, in this embodiment, three pick-up nozzles indicated by the reference numerals 51, 53 and 55. The pick-up nozzles 51, 53 and 55 are of the vacuum-type, but it should be readily apparent to those skilled in the art that the invention can be employed with other types of pick-up nozzles. Reference is made to the co-pending application filed in the name of the inventor hereof, entitled "Method for-Mounting Components And An Apparatus Therefor", Ser. No. 08/086,512, filed Jul. 1, 1993, and assigned to the Assignee hereof, for a more detailed description of how the plural pick-up nozzles may be mounted on a single mounting head. The disclosure of that application is incorporated herein by reference.

Briefly summarized, each of the pick-up nozzles 51, 53 and 55 is mounted for movement in a vertical direction along a Z axis by the mounting head 27 and is driven for movement in such direction by a respective Z axis servo motor 57, 59 and 61. Encoders 63, 65 and 67 are coupled to the drive motors 57, 59 and 61, respectively, so as to provide an output signal indicative of the Z coordinate position of the respective nozzles 51, 53 and 55, as shown in FIG. 4.

In addition, the nozzles 51, 53 and 55 are also supported for a rotation about vertical R axis in a manner described in the aforementioned co-pending application Ser. No. 08/086, 512. Rotational movement about these axes is obtained by R axis servo motors 69, 71 and 73, which are coupled to nozzles 51, 53 and 55, respectively, for affecting rotary movement. Encoders 75, 77 and 79 are connected to the motors 75, 77 and 79, respectively, and provide output signals indicative of the angular position about the rotational R axis. Again, the relationship of these components is shown in FIG. 4.

The mounting head 27 of the pick-up and recognition device 25 also detects the position of components which are picked up by the pick-up nozzles 51, 53 and 55, so as to make correction factors for misalignment of their pick-up from their position so that when they are positioned on the substrate 23 they will be positioned in an accurate location.

The respective pick-up nozzles 51, 53 and 55 are each provided with an interference position detector 81, 83 and 85, respectively, for detecting the position of the pick-up nozzle in relation to the delivery stations 13 and 15. As discussed below, the respective interference position detectors 81, 83 and 85 determines if its pick-up nozzle 51, 53 and 55 has been elevated sufficiently clear from the individual feeder 19 or 21 so as to begin movement of the mounting head 27.

A vacuum source (not shown) is connected to the pick-up nozzles 51, 53 and 55 by way of a valve-or the like to apply vacuum to the nozzles when required to pick up chip components.

The pick-up and recognition device 25 also insures that the position of the components after being picked up is detected to enable correction factors for misalignment from -an ideal position to be calculated to enable them to be positioned in an accurate location.

For simplicity, the apparatus 11 of the present invention is described in connection with an optical detector comprising a laser unit 87. It will be appreciated, however, that the principles of the present invention are applicable when other forms of detectors are utilized. The laser unit 87 includes two primary components, a laser light source 89 and a laser light detector 89 facing one another on both sides of the pick-up nozzles. As will be appreciated from FIG. 1, the pick-up nozzles 51, 53 and 55 are located to avoid overlapping of the pick-up nozzles in the direction of the casting laser beams. Thus, while the laser unit 89 is oriented so that the laser beams are cast in the X direction, the pick-up nozzles are obliquely staggered with respect to the X-axis, so that images of the nozzles are projected on different areas of the detector of the laser unit. It should be noted that while chip components are usually picked up as shown in FIG. 3, with one component for each pick-up nozzle, a relatively large chip component will be picked up by the pick-up nozzle 53 in the center only, or by the pick-up nozzles 51 and 55 on both sides only. Thus, the pick-up nozzles 51, 53 and 55 are suitably selected according to the sizes of the chip components to be picked up.

FIG. 4 illustrates the apparatus 11 schematically for purposes of illustrating the interrelationship of the components for control purposes. The apparatus 11 includes a main controller 93 which has an axis controller or axis driver which controls the operation of the X-axis servo motor, the Y-axis servo motor, the Z-axis servo motors, and the R-axis servo motors associated with the first, second and third pick-ups nozzles, respectively. This axis driver controller circuit also receives back signals from the various encoders or position detectors associated with the aforenoted servo motors.

The access controller driver unit receives its signals from a main processor 97 so as to effect movement in accordance with the procedures which will be described herein and also the procedures described in each of the three (3) co-pending applications which deal primarily with the movement for pick-up and mounting and the specific recognition techniques employed therein.

The main processor 97 directs automatic pick-up and mounting of chip components according to a program preset determined by the type of circuit board on which the chip components are to be mounted. The main processor 97 recognizes the components by means of operation of the axis controller through use of the servo motors, thereby detecting the projected width of the picked up chip components. The main processor 95 also determines mounting position correction amounts for the individual chip components based on the signals issued by a laser unit processor through an input/output device 101, which in turn are based on signals representing projected chip components widths detected by the laser unit. This information is then utilized by the axis controller 95 to perform the correct positioning of the head 27 by the axis controller 95 and is transmitted to an average correction amount processor 103. While the average correction amount processor 103 is shown as a separate element on the block diagram for conceptual clarity, the main processor 97 will also be the average correction amount processor 103, so that there are not physically distinct processors. The correction amount processor 103 stores this information in succession in a memory section (not shown).

When the number of data entries reaches a preset value, the average correction amount processor 103 reads the stored data and calculates its average. Specifically, the average correction amount processor 103 includes three memory sections, corresponding to each of the pick-up nozzles 51, 53 and 55, which store the data issued from the main processor 101. The average correction amount processor 103 first calculates an average correction amount for the first nozzle 51, the second nozzle 53, and the third nozzle 55. Then an average correction amount is calculated based upon an average of these individual correction amounts. This overall correction amount is then utilized by the main processor 97 to alter the program preset to change the pick-up point preset for the apparatus.

Figure 5:
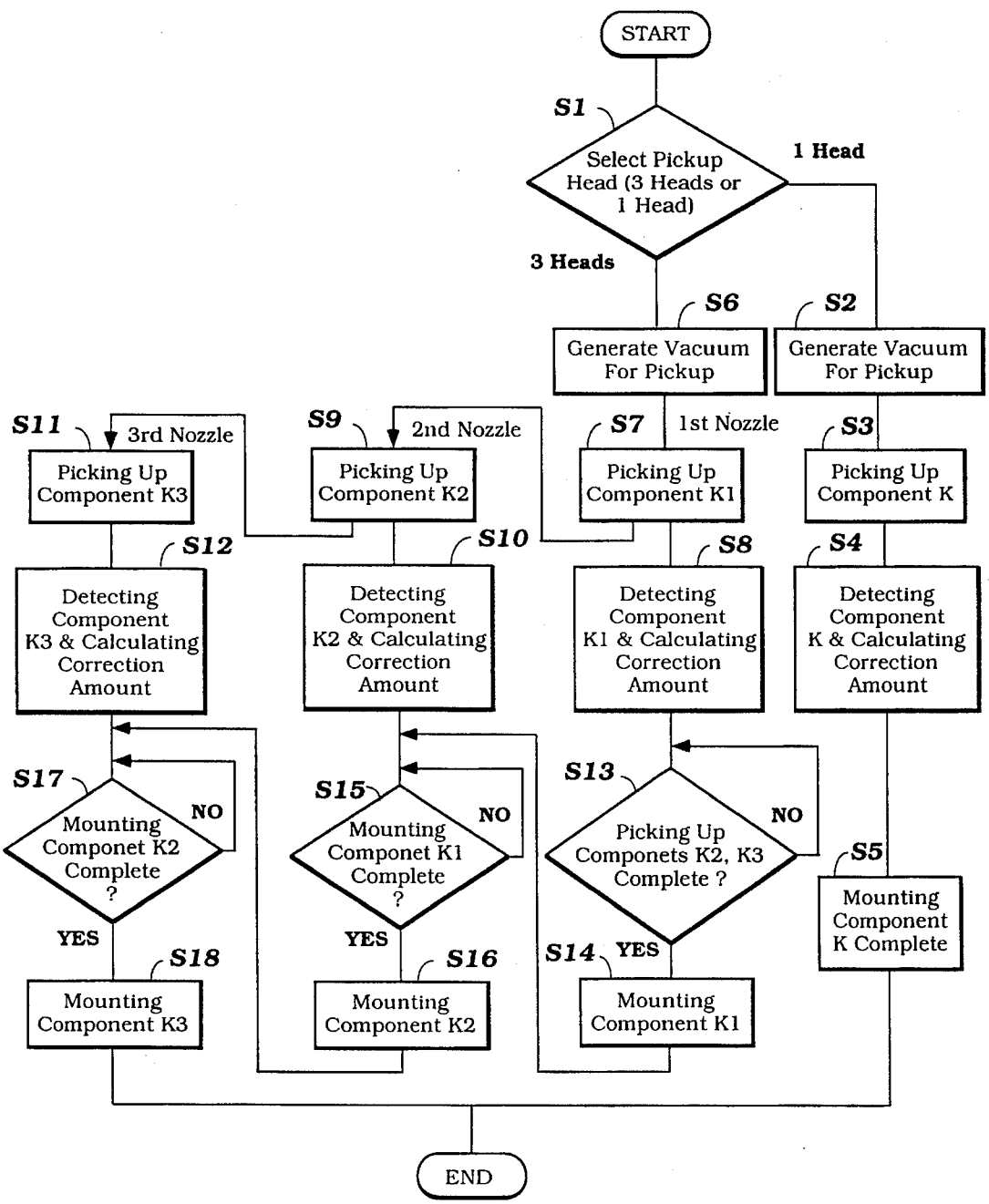
FIG. 5 is a block diagram showing a control routine in accordance with the method of the present invention.

The manner in which the main controller 93 operates will now be described in greater detail, with reference to FIG. 5. While the preferred embodiment utilizes three pick-up nozzles, as discussed above, depending upon the size of the chip components, the apparatus may utilize one, two or three pick-ups nozzles. Accordingly, the flow chart of FIG. 5 discusses selective use of either one or three pick-up nozzles.

After the start of the subroutine, at step S1, a decision is made as to the desired number of pick-up heads to be utilized (either three nozzles or one nozzle) based on the size of the component. When a single nozzle is selected in step 1, the process proceeds to step 2. In step 2, the vacuum is applied from a vacuum source (not shown) to one of the three pick-up nozzles, and the head 27 is moved in the X-axis and Y-axis directions toward the pick-up location. When the head 27 reaches the pick-up location corresponding to the desired individual feeder, the pick-up nozzle is lowered and an intended chip component K is picked up (step S3).

When the pick-up of the chip component K is complete, the pick-up nozzle is raised, and the head 27 is moved to the printed circuit board to mount the chip component K. During movement of the head 27, the chip component K is recognized by the laser unit 87 and the correction value for the component mounting position is calculated based on the detected data (step 54). Accordingly, when the head 27 reaches the position corrected by the correction value, the pick-up nozzle is lowered with a simultaneous stop of the application of vacuum to the pick-up nozzle and the mounting of the chip component K to the printed circuit board, thus completing the mounting process (step S5).

Alternatively, when the size of the components are such that the mounting operation utilizes all three pick-up nozzles, based on the decision process of step 1, the process proceeds to step S7. The pick-up, recognition and mounting process of each of the three pick-up nozzles takes place in parallel, but is impacted by the process of the other nozzles.

Once the determination is made that three nozzles will be used, vacuum is applied to each of the three pick-up nozzles in step S6, and the head is immediately moved to the component supply section. During this process, the first nozzle is lowered and an intended chip component K1 is picked up (as 7). When the pick-up of the chip component K1 by the first pick-up nozzle is complete, the unit is immediately moved to enable the second pick-up nozzle to pick up a chip component. During the movement of the head towards the subject feeder to pick up the intended chip component K2, the apparatus performs the recognition technique on component K1 picked up by the first pick-up nozzle and begins to calculate the appropriate correction amounts (step S8), as will be discussed in greater detail below. When the head reaches the appropriate position above the desired feeder for the second nozzle, the second pick-up nozzle lowers and picks up the intended chip component K2 (step S9).

When the pick-up of the chip component K2 by the second pick-up nozzle is complete, the head immediately moves toward the chip pick-up location for the third pick-up nozzle. During this process, the apparatus is performing the component recognition process and to calculate the appropriate correction amounts for the chip component K2 picked up by the second pick-up nozzle (step S10). When the head reaches a position above the feeder corresponding to the third pick-up nozzle pick-up position, the third pick-up nozzle lowers and picks up the intended chip component K3 (step S11).

When pick-up of the chip component K3 by the third pick-up nozzle is complete, the apparatus proceeds with the component recognition process for the chip component K3 picked up by the third pick-up nozzle (step S12).

Immediately after step 8, the apparatus checks to determine whether components K2 and K3 have been picked up by the apparatus (step S13). If not, this portion of the program repeats until this process is completed. However, if the pick-up of components K2 and K3 is complete, then the mounting of chip component K1 commences (step S14). Specifically, the head unit is moved to the position on the printed circuit board dictated by the correction amount for mounting the chip component K1. When the head reaches the intended position, the first pick-up nozzle lowers while vacuum is gradually weakened so the chip component K1 is mounted on the printed circuit board. Then the process proceeds to step S15.

In a manner similar to the control loop of the subroutine of the first pick-up nozzle, the second pick-up nozzle determines whether the mounting of component K1 has been completed (step S15). If not, the program repeats until the mounting of component K1 is indicated to have been completed. When the mounting of component K1 is determined to have been completed, the chip component K2 is mounted and thereafter proceeds to step S17.

Similarly, in step S17, the subroutine inquires as to whether the component K2 has been mounted, and if not, it repeats until the inquiry is answered in the affirmative. Once the question is answered affirmatively, the process proceeds to step S18 and the component K3 is mounted.

As discussed above, the foregoing process incorporates the step of modifying the pick-up point for each component. This modification process will now be described in greater detail with reference to the flow chart of FIG. 6. Specifically, this modification of the pick-up point occurs at the time of component recognition (steps S4, S8, S10 and S12), indicated on the block diagram of FIG. 5. For simplicity, the following description assumes that the initial decision (step S1) in the process of FIG. 5 was to utilize three pick-up nozzles and that the shape of the chip component is rectangular.

When the chip component is picked up by the first nozzle from the component supply section, the chip component is typically raised to a specified height for recognition, and rotated by a specified angle with respect to the direction of the laser beam (X-axis direction) of the laser unit. This places the chip component in an initial position with its longer side tilted relative to the direction of the laser beam on the laser unit.

At the beginning of the subroutine, at step S20, a determination is made as to whether the nozzle has been raised to the specified recognition height and the preliminary rotation has been completed. If not, the program repeats.

If, on the other hand, the component has been raised to its recognition height and the preliminary rotation has been completed, the process proceeds to step S21 in which the chip component is placed in the initial position and its projected width $W_s$, central position $C_s$ and rotary angle $\theta_s$ are determined.

When this determination is completed, the nozzle is rotated in the opposite direction and the program determines whether the nozzle has rotated from the initial position by a specified angle of $\theta_e$ to find a position where the projected width is at a minimum (step S23). If not, the program waits until it determines that this rotation has occurred. Once the program determines that a rotation $\theta_e$ has occurred, the minimum projected width $W_{min}$, the central position $C_m$, and the rotary angle $\theta_m$ are detected (step S24).

Once these values are determined, the program utilizes these values to determine whether the chip component has been picked up correctly (step S25). If not, the process proceeds to step S26 and the chip component is removed. If, on the other hand, the component has been picked up normally, the process proceeds to step 27 in which the mounting position correction amounts $X_c$, $Y_c$ and $\theta_c$ are calculated for the directions X, Y and θ. That is, in step 27, the length of the shorter side, displacement of the component central position in the shorter side direction of the chip component, and the rotary angle displacement are obtained from the minimum projected width $W_{min}$, central position $C_m$ and rotary angle θ. From these and other data, the length of the longer side, and the displacement of the component central position in the longer side direction are obtained. From these results, the mounting position correction amounts $X_c$, $Y_c$ and $\theta_c$ are calculated. This process is set forth in greater detail in U.S. patent application Ser. No. 08/073,741, previously incorporated herein by reference.

While the head 27 is being moved to the corrected mounting position and the chip component is being mounted, the main processor 97 is transmitting these correction amounts to the average correction processor 103 (in the preferred embodiment this step is unnecessary as the main processor 97 and the average correction amount processor 103 are the same processor). Similarly, after these calculations are performed for the chip component K2 picked up by the second nozzle and the correction amounts for the chip component K3 picked up by the third nozzle, these correction amounts are calculated in a similar manner and similarly transmitted and stored in the average correction processor 103 and associated memory (not shown).

After the mounting process is completed, the head returns to the component delivery station, the counter in the average correction amount processor is increased sequentially (step S28). Thereafter, a determination is made as to whether the value of the counter has reached a specified value K (step S29). If not, this aspect of the control process terminates.

If, on the other hand, the counter value has reached the preset value K, the process proceeds to step S30, and an average of the mounting position correction data stored as described above in the average correction amount calculating processor 103 is calculated. Generally, as described in greater detail below, the average correction amount calculating processor averages the X-axis correction amounts, the Y-axis correction amounts and the Y-axis correction amounts for each of the nozzles.

As set forth in the equations below, after these averages have been computed, an overall average for each coordinate is calculated from the average correction amounts for each of the X-axis and Y-axis directions (step S31):

$$\left[\begin{array}{l}\overline{X}ca = \frac{Xca1 + Xca2 + \ldots + Xcak}{k} \\ \overline{Y}ca = \frac{Yca1 + Yca2 + \ldots + Ycak}{k}\end{array}\right]$$

$$\left[\begin{array}{l}\overline{X}cb = \frac{Xcb1 + Xcb2 + \ldots + Xcbk}{k} \\ \overline{Y}cb = \frac{Ycb1 + Ycb2 + \ldots + Ycbk}{k}\end{array}\right]$$

$$\left[\begin{array}{l}\overline{X}cc = \frac{Xcc1 + Xcc2 + \ldots + Xcck}{k} \\ \overline{Y}cc = \frac{Ycc1 + Ycc2 + \ldots + Ycck}{k}\end{array}\right]$$

$$\left[\begin{array}{l}\overline{X}c = \frac{\overline{X}ca + \overline{X}cb + \overline{X}cc}{3} \\ \overline{Y}c = \frac{\overline{Y}ca + \overline{Y}cb + \overline{Y}cc}{3}\end{array}\right]$$

Once these calculations have been completed, the existing pickup point $(X_{pm}, Y_{pm})$ for the tape feeders are changed to those representing a new pickup point (X,Y) based on the average correction amounts described above in accordance with the following equations (step S32).

$$\left[\begin{array}{l}X = Xpm + \overline{X}c \\ Y = Ypm + \overline{Y}c\end{array}\right]$$

Figure 6:
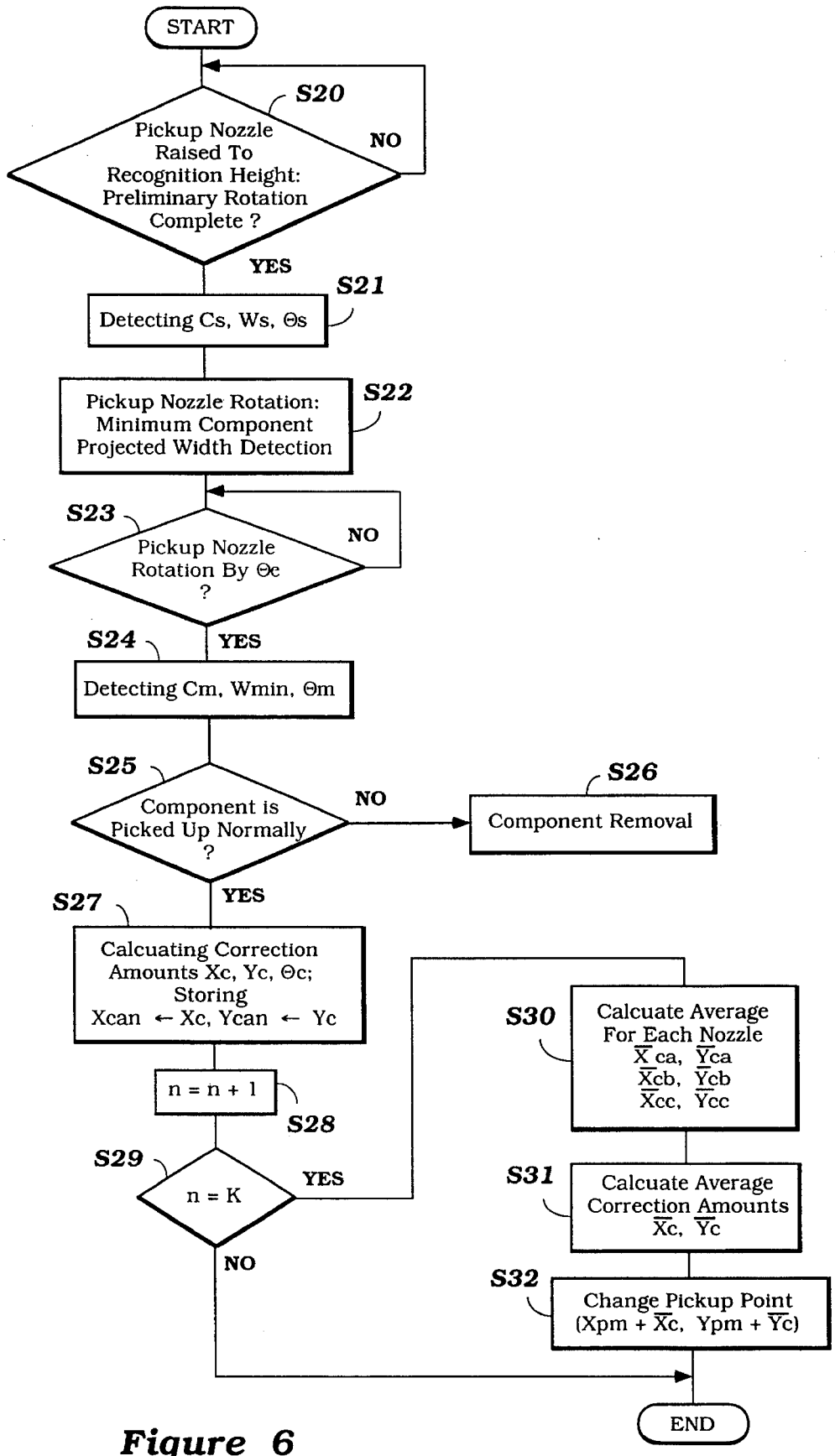
FIG. 6 is a block diagram showing another aspect of the control routine of the mounting apparatus of the present invention.

After this new pickup point is set, the process set forth on the block diagram of FIG. 6 terminates, until a new chip component is picked up from the component supply section by the mounter.

As will be appreciated, a mounter utilizing the method of the present invention is capable of picking up the central position of the chip component more accurately than prior art mounters. With a conventional mounter, in which the pickup point is preset, if the pickup point of the chip component is displaced as a result of a mechanical error in the initial setting position of the tape feeders relative to the component supply section, or as a result of a drive error in the head unit, the chip components fed out of the tape feeders are always picked up at a point displaced from the chip component central position. With the mounter of the above embodiment, however, the average correction amount is utilized to reset the pickup point, so that any consistent error resulting from a mechanical error in the initial setting position or a consistent error of the drive unit will result in a corrected pickup point location either identical to or near the component central position. In particular, this moving average will generally result in the error in the mounting position being a small value, thereby improving mounting accuracy, and reducing the possibility of incomplete pickup due to excessive displacement in the initial pickup position.

In an alternative embodiment, the calculation for obtaining the average correction amount could be made using the average correction amount for a single pickup nozzle and applying this value to all three nozzles. On the other hand, a more accurate pickup point correction can be made by using the technique outlined above in which the mounting position correction amounts are sampled and averaged for each of three pickup nozzles, and the averages for respective pickup nozzles are averaged.

I claim:

1. An apparatus for picking up a component at a pick up station and depositing that component in an accurate position at a deposit station, comprising a gripping device, a support mechanism for supporting said gripping device for movement between a component delivery position where a component may be picked up and a component mounting position where a component may be deposited; a detector for measuring at least one parameter of a component picked up by said gripping device from said component delivery position; a controller connected to said gripping device and said detector and said support mechanism, said controller comprising means for calculating a picked up position of a component picked up by said gripping device based on measurements communicated to said processor by said detector;

means for calculating a pick up location correction amount;

means for calculating an average pick up location correction amount from a specified number of pick up location correction amount data calculated by said pick up location correction amount calculating means; and pick up point changing means for setting a new pick up location in which said gripping device is positioned by said support mechanism based on said average pick up location correction amount calculated by said average pick up location correction amount calculating means.

2. An apparatus as set forth in claim 1 wherein said gripping device comprises a plurality of members, each of said plurality of members being configured to pick up a separate component.

3. An apparatus as set forth in claim 2 wherein said correction amount calculating means calculates said average correction amount from the average of the correction values for each of said plurality of members.

4. An apparatus as set forth in claim 2 wherein said correction amount calculating means calculates said average correction amount from the average of the correction values for less than all of said plurality of members.

5. An apparatus as set forth in claim 4 wherein said correction amount calculating means calculates said average correction amount from the average of the correction values for one of said plurality of members.

6. An apparatus as set forth in claim 1 wherein said detector comprises an optical detector.

7. An apparatus as set forth in claim 6 wherein said optical detector is positioned to measure the length of a component held by said gripping device.

8. An apparatus as set forth in claim 1 wherein said gripping device is rotatable about a rotational axis "R" and moveable along "X", "Y" and "Z" axes from the pick up station to the deposit station, further comprising a measuring station for measuring the projected width of the component in a plane parallel to the axis of rotation of the gripping device, said measuring station further comprising means for measuring the projected width of the component in the plane at two angular rotations and measuring the angular rotation between the two measured positions for determining the place where the component has been picked up by the gripping device.

9. An apparatus as set forth in claim 8 wherein the component is rotated to a second position wherein the projected width in the plane is at an extreme of the projected width in the plane.

10. An apparatus as set forth in claim 9 wherein the component is rotated to a second position wherein the projected width in the second position is the narrowest width.

11. An apparatus as set forth in claim 9 wherein said gripping device comprises a plurality of members, each of said plurality of members being configured to pick up a separate component.

12. An apparatus as set forth in claim 11 wherein said correction amount calculating means calculates said average correction amount from the average of the correction values for each of said plurality of members.

13. An apparatus as set forth in claim 11 wherein said correction amount calculating means calculates said average correction amount from the average of the correction values for less than all of said plurality of members.

14. An apparatus as set forth in claim 13 wherein said correction amount calculating means calculates said average correction amount from the average of the correction values for one of said plurality of members.

15. A method of more accurately mounting a component with an apparatus which picks up a component at a pick up station and deposits that component in a position at a deposit station, comprising:

picking up a component with said apparatus at a first location corresponding to a component delivery position;

determining the picked up position of said component;

calculating a pick up location correction amount;

calculating an average pick up location correction amount from a specified number of pick up location correction amount data; and changing said first location based on said average pick up location correction amount.

16. The method as set forth in claim 15 wherein said determining step is performed by calculating said picked up position of said component based on measurements communicated to said processor by at least one of an optical detector or a gripping device position sensor.

17. The method as set forth in claim 16 wherein said determining step is performed by calculating said picked up position of said component based on measurements communicated to said processor by both an optical detector and a gripping device position sensor.

18. The method as set forth in claim 17 wherein said apparatus is defines a plurality of members, each being configured to pick up a separate component, further comprising calculating said average correction amount from the average of the correction values for at least one of said plurality of members.

19. The method as set forth in claim 18, further comprising calculating said average correction amount from the average of the correction values for more than one of said plurality of members.

20. The method as set forth in claim 19, further comprising calculating said average correction amount from the average of the correction values for each of said plurality of members.

21. The method as set forth in claim 15 further comprising measuring the projected width of the component in a plane parallel to the axis of rotation of the gripping device when the component is in a first angular position, rotating the component to a second angular postion, measuring the projected width of the component in its second position in the plane and measuring the angle of rotation between the first and second measured positions and calculating the place where the component has been picked up from the width and angle measurements.

22. The method as set forth in claim 21 wherein the component is rotated to a second position wherein the projected width in the plane is at an extreme of the projected width in the plane.

23. The method as set forth in claim 22 wherein the projected width in the second position is the narrowest width.

24. The method as set forth in claim 23 further comprising picking up a plurality of separate components with said gripping device and calculating an average pick up location correction amount from the average of the correction values for each of said plurality of components.

25. The method as set forth in claim 23 further comprising calculating said average correction amount from the average of the correction values for less than all of said plurality of components.

26. The method as set forth in claim 25 further comprising calculating said average correction amount from the average of the correction values for one of said plurality of components.

27. An apparatus for picking up a component at a pick up station and depositing that component in an accurate position at a deposit station, comprising a gripping device adapted to hold and release a component, a support for moving said gripping device for movement between a pick up position and a component mounting position, a detector co-operable with said support and said gripping device for measuring the orientation of a component picked up by said gripping device for establishing a correction amount to be employed in the positioning of said component in said component mounting position, and a pick up correction device receiving said correction amount from said detector and employing said correction amount in the control of said support for adjusting subsequent movement of said gripping device to a new pick up position for minimizing the amount of subsequent correction amounts.

28. An apparatus as set forth in claim 27 wherein said gripping device comprises a plurality of members, each of said plurality of members being configured to hold and release a separate component and means for calculating an average correction amount.

29. A method of more accurately picking up a component at a pick up station and depositing that component in an accurate position at a deposit station, comprising gripping a component with a gripping device, moving said gripping device between a pick up position and a component mounting position, measuring the orientation of a component picked up by said gripping device, calculating a correction amount to be employed in the positioning of said component in said component mounting position, and adjusting subsequent movement of said gripping device to a new pick up position by employing said correction amount.

30. A method as set forth in claim 29 gripping a plurality of components with said gripping device and calculating a plurality of correction amounts based on an average of said plurality of said correction amounts.

* * * * *